US012305282B2

United States Patent
Krücken et al.

(10) Patent No.: US 12,305,282 B2
(45) Date of Patent: May 20, 2025

(54) SUSCEPTOR OF A CVD REACTOR

(71) Applicant: AIXTRON SE, Herzogenrath (DE)

(72) Inventors: Wilhelm Josef Thomas Krücken, Aachen (DE); Peter Sebald Lauffer, Aachen (DE)

(73) Assignee: AIXTRON SE, Herzogenrath (DE)

( * ) Notice: Subject to any disclaimer, the term of this patent is extended or adjusted under 35 U.S.C. 154(b) by 414 days.

(21) Appl. No.: 17/311,599

(22) PCT Filed: Dec. 6, 2019

(86) PCT No.: PCT/EP2019/083925
§ 371 (c)(1),
(2) Date: Jun. 7, 2021

(87) PCT Pub. No.: WO2020/120298
PCT Pub. Date: Jun. 18, 2020

(65) Prior Publication Data
US 2022/0074047 A1    Mar. 10, 2022

(30) Foreign Application Priority Data
Dec. 11, 2018  (DE) .................... 10 2018 131 751

(51) Int. Cl.
C23C 16/455     (2006.01)
C23C 16/458     (2006.01)
(Continued)

(52) U.S. Cl.
CPC .... *C23C 16/4584* (2013.01); *C23C 16/45508* (2013.01); *C23C 16/4586* (2013.01); *C30B 25/12* (2013.01); *C30B 25/14* (2013.01)

(58) Field of Classification Search
CPC .......... C23C 16/4584; C23C 16/45508; C23C 16/4586; C30B 25/12; C30B 25/14; H01J 2237/332–3348
(Continued)

(56) References Cited

U.S. PATENT DOCUMENTS

| 5,788,777 A | 8/1998 | Burk, Jr. |
| 6,569,250 B2 | 5/2003 | Paisley et al. |

(Continued)

FOREIGN PATENT DOCUMENTS

| DE | 603 04 850 T2 | 12/2006 |
| DE | 10 2006 018 514 A1 | 10/2007 |

(Continued)

OTHER PUBLICATIONS

Written Opinion mailed Apr. 2, 2020, from the ISA/European Patent Office, for International Application No. PCT/EP2019/083925 (filed Dec. 6, 2019), English translation, 7 pgs.

(Continued)

*Primary Examiner* — Charlee J. C. Bennett
(74) *Attorney, Agent, or Firm* — Ascenda Law Group, PC

(57) ABSTRACT

A susceptor for a CVD reactor includes a bearing surface for supporting a substrate holder. A carrier gas is fed into an inner radial zone, in order to floatingly cushion a substrate holder supported above the bearing surface. The gas fed into the inner radial zone leaves a second radial zone through discharge channels and to a slight extent through a gap surrounding the second radial zone and assigned to a third radial zone. The cross-sectional area of the discharge channels and the radial length of the gap are dimensioned such that the volumetric flow of the gas through the discharge channels is greater than through the gap if the latter has a gap height of 200 μm.

12 Claims, 8 Drawing Sheets

(51) Int. Cl.
 *C30B 25/12* (2006.01)
 *C30B 25/14* (2006.01)

(58) Field of Classification Search
 USPC ......... 118/715–733 W; 156/345.1–345.55 W
 See application file for complete search history.

(56) References Cited

U.S. PATENT DOCUMENTS

| | | | |
|---|---|---|---|
| 6,824,619 B1 * | 11/2004 | Kuznetsov | H01L 21/67784 118/500 |
| 7,198,677 B2 * | 4/2007 | Yoo | H01L 21/6708 156/345.23 |
| 8,628,622 B2 * | 1/2014 | Saxler | C23C 14/505 156/345.33 |
| 9,273,392 B2 * | 3/2016 | Vermeer | C23C 16/54 |
| 9,447,500 B2 | 9/2016 | Ruda Y Witt et al. | |
| 2003/0188687 A1 * | 10/2003 | Paisley | C23C 16/4584 118/730 |
| 2006/0054091 A1 * | 3/2006 | Speciale | C30B 25/10 156/345.55 |
| 2006/0199131 A1 * | 9/2006 | Kawasaki | H01L 21/67103 432/120 |
| 2008/0210169 A1 * | 9/2008 | Pozzetti | H01L 21/6838 118/730 |
| 2012/0204796 A1 * | 8/2012 | Ruda Y Witt | C23C 16/481 118/728 |
| 2012/0291707 A1 * | 11/2012 | Granneman | C23C 16/45548 118/724 |
| 2014/0251542 A1 * | 9/2014 | Parsey, Jr | H01L 21/68735 427/256 |
| 2015/0252493 A1 * | 9/2015 | Okabe | C30B 25/165 118/715 |

FOREIGN PATENT DOCUMENTS

| | | |
|---|---|---|
| DE | 10 2009 044 276 A1 | 5/2011 |
| GB | 2 264 959 A | 9/1993 |

OTHER PUBLICATIONS

International Preliminary Report on Patentability issued Jun. 8, 2021, from The International Bureau of WIPO, for International Application No. PCT/EP2019/083925 (filed Dec. 6, 2019), 17 pgs.
International Search Report mailed Apr. 2, 2020, from the ISA/European Patent Office, for International Application No. PCT/EP2019/083925 (filed Dec. 6, 2019), 8 pgs.
Written Opinion mailed Apr. 2, 2020, from the ISA/European Patent Office, for International Application No. PCT/EP2019/083925 (filed Dec. 6, 2019), 8 pgs.

* cited by examiner

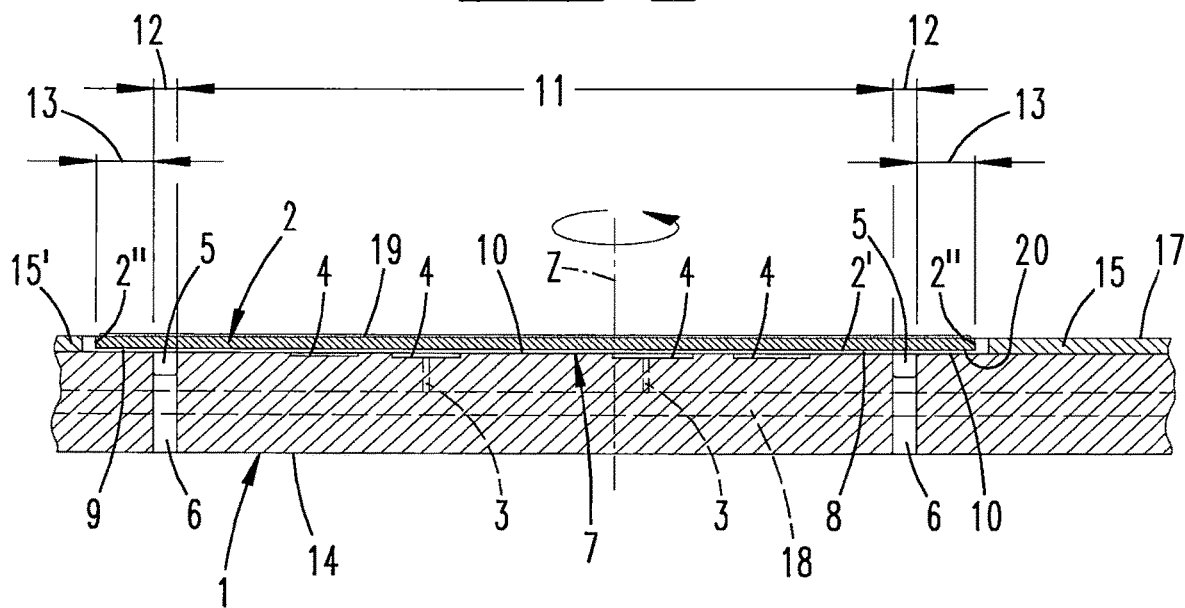
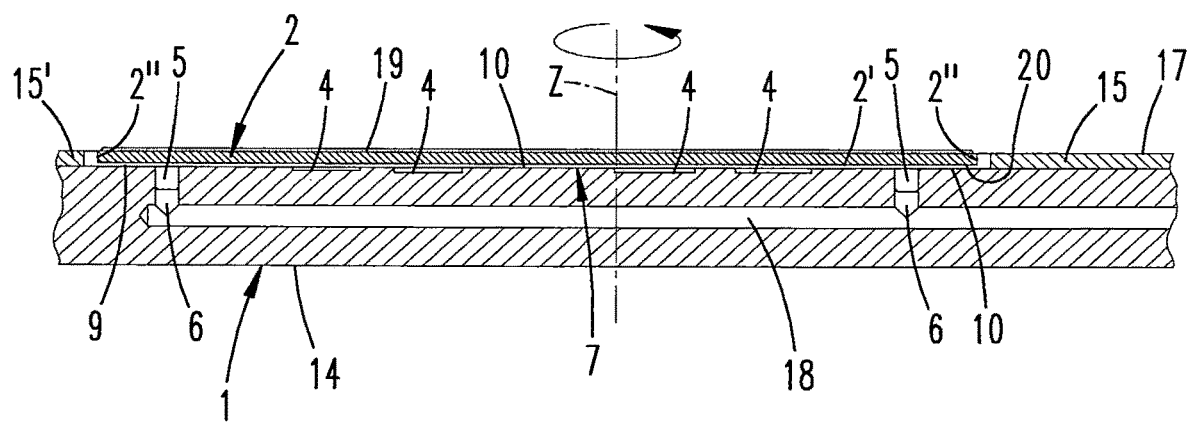

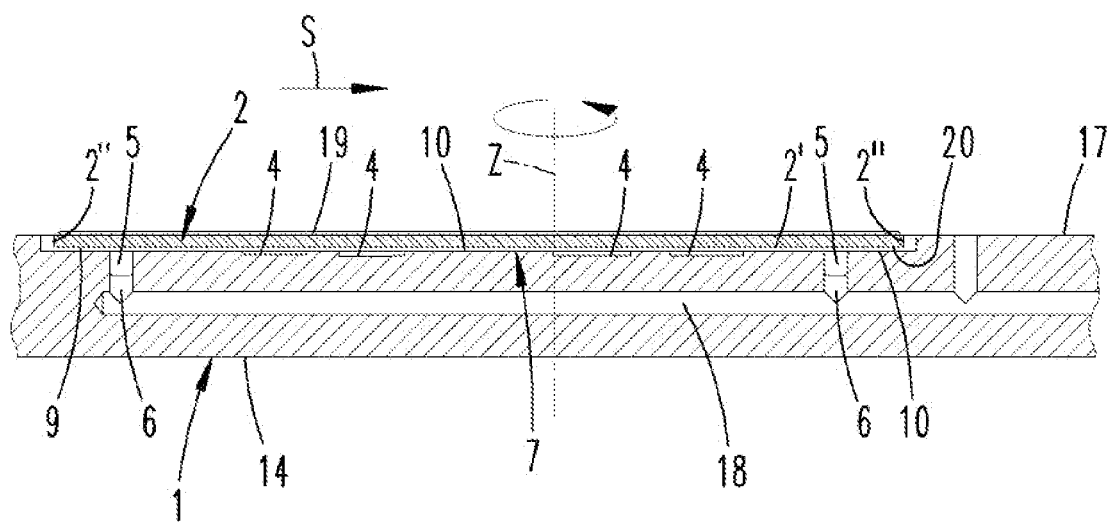
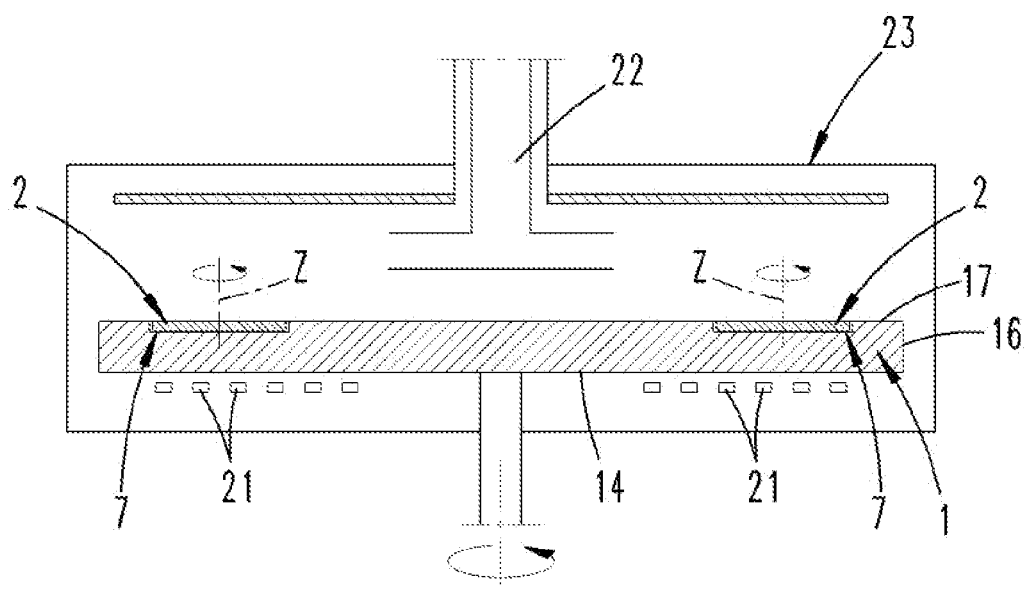

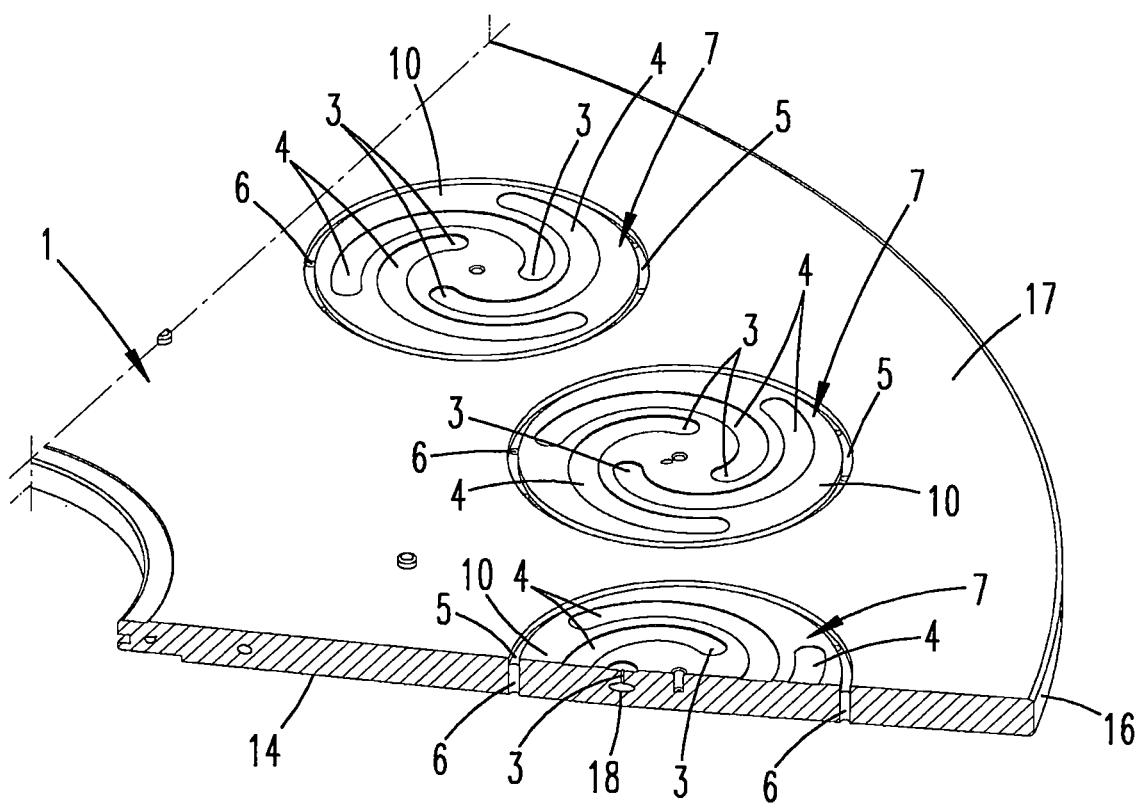

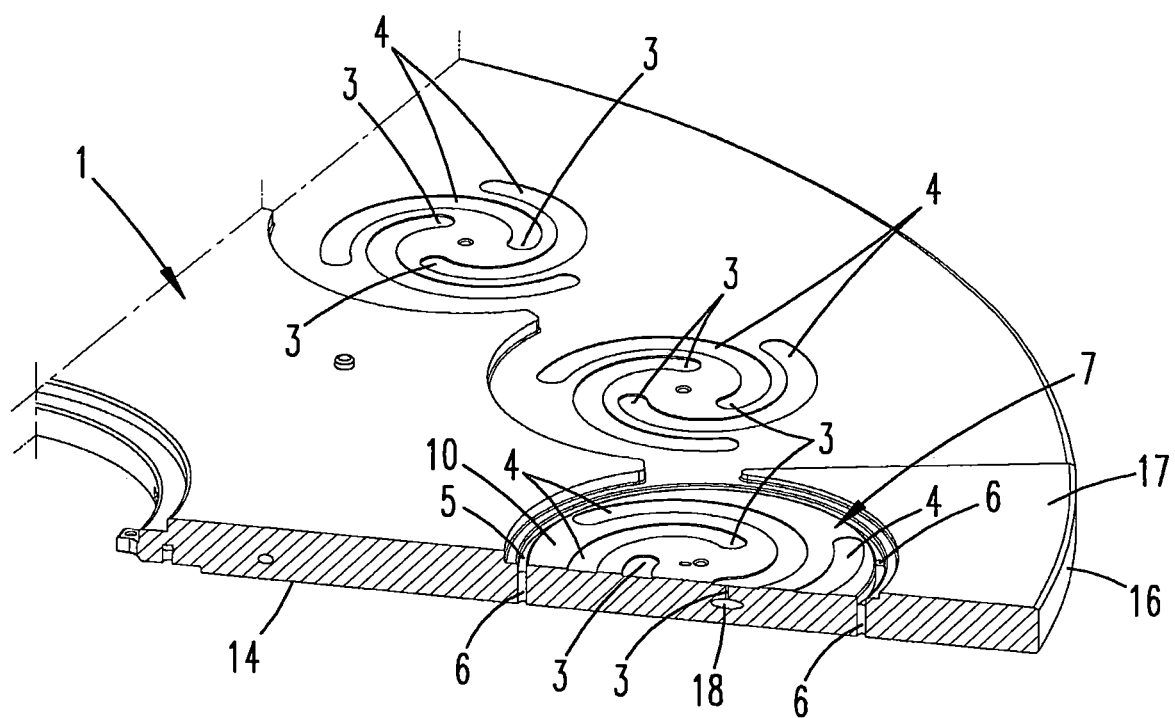

SUSCEPTOR OF A CVD REACTOR

RELATED APPLICATIONS

This application is a National Stage under 35 USC 371 of and claims priority to International Application No. PCT/EP2019/083925, filed 6 Dec. 2019, which claims the priority benefit of DE Application No. 10 2018 131 751.4, filed 11 Dec. 2018.

FIELD OF THE TECHNOLOGY

The invention relates to a susceptor having at least one bearing surface with a circular outline, for the support of a circular disc-shaped substrate holder such that it can rotate about a center of the bearing surface, wherein the bearing surface has a first radial zone, in which at least one gas distribution channel extends, into which opens a gas supply line, a second radial zone, which—with respect to the center—is radially offset from the first radial zone, and which forms a gas discharge system with one or more discharge channels, and a third radial zone, which surrounds the first radial zone and the second radial zone, and forms a gap, directly adjacent to the radially outer edge of the bearing surface, between the bearing surface and the substrate holder, wherein the radial zones are designed such that a gas flow fed into the first radial zone through the gas supply line generates a pressure in a volume between the bearing surface and the lower face of the substrate holder, which pressure holds the substrate holder in a floating state, and which leaves the volume through the gas discharge system and through the gap.

The invention further relates to a susceptor arrangement, formed from a susceptor and one or a plurality of substrate holders, having a CVD reactor, such a susceptor, or a susceptor arrangement, and a use of a susceptor, or a susceptor arrangement, in a CVD reactor.

BACKGROUND

A susceptor of the type described above is known in the art from U.S. Pat. No. 9,447,500 B2 (DE 10 2009 044 276 A1).

A susceptor in accordance with the invention is part of a CVD reactor, and forms a susceptor arrangement with a substrate holder supported on a bearing surface. The susceptor has the shape of a circular disc, with bearing surfaces arranged around the center of the circle, in each case for the support of a substrate holder. Each substrate holder is mounted in a pocket on the upper face of the susceptor such that it can rotate about a figure axis. The bearing surface has three radial zones. In an inner radial zone are located spiral-shaped gas distribution channels in the floor of the pocket, which are fed with a carrier gas through gas supply lines. The carrier gas lifts the substrate holder into a floating position and provides a rotary drive for the substrate holder. In a second radial zone surrounding the first radial zone is located a gas collection channel, from which originate gas discharge channels, so as to discharge the carrier gas from the volume. A third radial zone, extending radially outside the second radial zone, forms a gap, through which, in the prior art, a not inconsiderable proportion of the carrier gas can escape from the volume between the bearing surface and the lower face of the substrate holder. The gas exiting through the gap enters the process chamber arranged above the susceptor, through which flows a process gas that is diluted by this discharge gas flow. The gas flow through the gap forms a flow transverse to the process gas flow, and thus disturbs the flow profile of the process gas flow.

The prior art also includes DE 603 04 850 T2, GB 2 264 959 A and U.S. Pat. No. 5,788,777 A.

SUMMARY OF THE INVENTION

The object underlying the invention is that of the specification of measures with which the disturbance of the process gas flow, that is to say, a dilution of the process gas by the gas forming a gas cushion for the support of the substrate holder, is reduced.

The object is achieved by the invention specified in the claims. The subsidiary claims represent not only advantageous further developments, but also autonomous achievements of the object.

First and foremost, the invention proposes a susceptor for use in a CVD reactor, which forms one, preferably a plurality of, circular bearing surfaces. The bearing surfaces can be arranged on a peripheral line around a center of the preferably circular disc-shaped susceptor. The bearing surfaces can be arranged in a densest arrangement along the peripheral line. Recesses can be arranged in the broad surface of the susceptor forming the bearing surface, in which circular disc-shaped substrate holders are arranged, wherein the floors of the recesses form bearing surfaces. However, the pockets formed in this way can also be formed by cover plates lying on a broad surface of the susceptor. The susceptor in accordance with the invention has a bearing surface with a first radial zone. The first radial zone can be an innermost radial zone extending across the center, in which at least one gas channel, in particular a spiral-shaped gas channel, extends. The gas channel can be a recess in the floor of a pocket forming the bearing surface. A gas supply line, through which a carrier gas can be fed into the gas distribution channel, opens into the radially innermost region of the gas distribution channel. The inventive susceptor has a bearing surface with a second radial zone which, with respect to the center, is radially offset from the first radial zone. The second radial zone is preferably formed by a gas collection channel surrounding the first radial zone, wherein the gas collection channel can be an annular recess in the floor of a pocket forming the bearing surface. The second radial zone has one or more discharge channels. The discharge channels preferably originate from the gas collection channel and issue at a distance from the bearing surface. The discharge channels can terminate at a rear face of the susceptor facing away from the broad surface forming the bearing surface. However, the discharge channels can also terminate at an edge, in particular a peripheral edge, of the susceptor. However, provision is also made for the discharge channels to issue downstream with respect to a process gas flow of the bearing surface flowing through the process chamber of the CVD reactor, wherein provision is in particular made for the discharge channels to issue into a zone arranged radially outside the bearing surface. In particular, provision is made for four, six, or more, discharge channels to originate from the gas collection channel. The diameter of the bearing surface can have a diameter of approximately 10 cm, 15 cm or 20 cm for the mounting of a four-inch wafer, six-inch wafer or eight-inch wafer, wherein provision is in particular made for a discharge channel to be located at least every four to ten centimeters along the peripheral extent of the preferably circular gas collection channel. Radially outside the second radial zone having the discharge channels, the inventive susceptor has a third radial zone which, together with an annular, radially outermost region of the substrate holder, forms a gap. The substrate holder has the shape of a circular disc, and covers the first and second radial zones with a radially inner region of its lower face. The radially outer region of the lower face forms a boundary surface for a peripheral gap, which on the other side is bounded by a surface of the bearing surface formed by the third radial zone. A gas flow fed into the first radial zone through the gas supply line generates a pressure in a volume between the bearing surface and the lower face of the substrate holder. This pressure holds the substrate holder in a floating state. The gas fed into the volume leaves the volume through the gas discharge system and the gap between the peripheral surface of the third radial zone and the edge zone of the substrate holder. In accordance with the invention, the cross-sectional area of the discharge channels and the radial length of the gap are dimensioned such that the gas volumetric flow rate through the gas discharge system is greater than that through the gap, if the gap does not exceed a maximum gap height of 300 µm. In accordance with the invention, by means of a variation of the gas flow fed into the volume, the gap height can be varied in a range between 50 µm and 300 µm, preferably in a range between 100 µm and 250 µm, so as to vary the height of the gas cushion, which has the consequence of influencing the heat transfer from a heater arranged below the substrate holder to a substrate supported by the substrate holder. An inventive susceptor has a surface surrounding the second radial zone and forming the gap, which surface has a radial extent of at least 4 mm. The bores formed by the discharge channels, the number of which is at least four, can have a diameter of at least 2 mm, preferably of at least 3 mm. In particular, provision is made for a plurality of bores to be arranged at constant intervals along the peripheral extent line of the circular second radial zone. The bores are preferably located in a circular gutter forming a gas collection channel, wherein the distance between adjacent bores can be a maximum of 10 mm or 20 mm. If the susceptor has a plurality of bearing surfaces, these are spaced apart from one another such that the distance between the gas collection channels of two adjacent bearing surfaces is at least 15 mm, preferably at least 20 mm. The bearing surfaces, arranged next to each other in densest contact, are preferably arranged along a circular arc line around the center of the susceptor. On a straight line connecting the centers of two adjacent bearing surfaces, the gas collection channels are preferably spaced apart by at least 15 mm, and particularly preferably by at least 20 mm, so that the substrate holders can overlap the gas collection channels with a sufficient radial spacing so as to bound a gap in each case. The surfaces bounding the gap are congruent annular surfaces, which can be stepped or corrugated in the radial direction. The gap preferably has a constant gap height over its entire gap surface. For this purpose, it is advantageous if the two surfaces bounding the gap are an edge zone, formed by planes, of the lower face of the substrate holder and the third radial zone of the bearing site. If one designates with r the radius of a bore forming the discharge channel, $l_a$ the length of this bore, with $\eta$ the dynamic viscosity of the carrier gas, and with $\Delta p$ the pressure difference between the pressure in the gas cushion and the pressure of the process chamber, the following relationship reflects the gas volumetric flow rate through a discharge channel:

$$Q_A = \frac{\pi \cdot r^4}{8 \cdot \eta \cdot l_a} \cdot \Delta P$$

If one further denotes with u the peripheral length of an annular gap of the third radial zone, with $l_s$ the radial length of the gap, and with h the maximum height of the gap, the following relationship reflects the volumetric flow rate flowing through the gap:

$$Q_S = \frac{u \cdot h^3}{12 \eta \cdot l_s} \cdot \Delta P$$

where u=π·d denotes the periphery of the second radial zone. In accordance with the invention, the number of discharge channels and their diameter (radius) are to be designed such that the sum of all gas flows $Q_a$ flowing through the discharge channels is greater than the gas flow $Q_s$ flowing through the gap with a maximum gap height h of 300 µm. This leads to the following design rule:

$$n \cdot r^4 > \frac{2 \cdot d \cdot l_a}{3 \cdot l_s} \cdot h^3$$

The left-hand side of this relationship is preferably at least twice as large, preferably at least five times as large, preferably at least ten times as large, preferably at least twenty times as large, and particularly preferably at least fifty times as large, as the right-hand side of the relationship with a gap height h=300 µm. For this purpose, it is in particular sufficient if a sufficiently high number of discharge channels is provided, whose diameter d is at least 2 mm, preferably at least 3 mm.

The invention further relates to a susceptor arrangement in which each bearing surface is associated with a circular disc-shaped substrate holder, which extends over all three of the radial zones, and which, in its radially outer region of the lower face, has a surface which, together with the surface of the third radial zone, bounds a gap.

The invention also relates to the use of such a susceptor, or such a susceptor arrangement, in a CVD reactor, or to a method for the deposition of layers on substrates, which are supported by the substrate holder during a deposition process. In this process, a carrier gas, for example hydrogen or nitrogen, is fed into the volume between the bearing surface and the lower face of the substrate holder. Within the volume between the lower face of the substrate holder and the bearing surface, a pressure is built up which lifts the substrate holder and holds it in a floating state. The gas flow is adjusted such that the gap height lies in a range between 50 µm and 250 µm. By virtue of the inventive dimensioning of the radial length of the third radial zone, and the number and cross-sectional area of the discharge channels, the discharge channels form a gas discharge system with a lower flow resistance than a maximum 300 µm size of gap.

The invention further relates to a CVD reactor, which has a gas inlet unit, through which process gases are fed into a process chamber, where the process gases are pyrolytically decomposed. The floor of the process chamber is formed by a susceptor as previously described, wherein the susceptor forms at least one bearing pocket, with which it forms a bearing surface for the support of a substrate holder. The susceptor preferably has a rotational symmetry, wherein the gas inlet unit is arranged in the region of the center of the susceptor. A plurality of pockets are arranged on a circular arc line around the center of the susceptor, in each of which pockets a substrate holder is supported.

The susceptor is driven in rotation about its axis of symmetry. A heating device arranged below the susceptor brings the substrates up to process temperature.

BRIEF DESCRIPTION OF THE DRAWINGS

Examples embodiments of the invention are explained below with reference to the accompanying drawings. Here:

FIG. 5 shows a schematic sectional illustration through a substrate holder 2, which lies in a pocket of a susceptor 1 of a first example embodiment, FIG. 6 shows an illustration as in FIG. 5 of a second example embodiment, FIG. 7 shows an illustration as in FIG. 5 of a third example embodiment, FIG. 8 shows schematically the arrangement of a susceptor arrangement 1, 2 in a CVD reactor with a housing 23, FIG. 9 shows an illustration as in FIG. 4 of a fourth example embodiment, FIG. 10 shows an illustration as in FIG. 4 of a fifth example embodiment.

DETAILED DESCRIPTION

Figure 1:
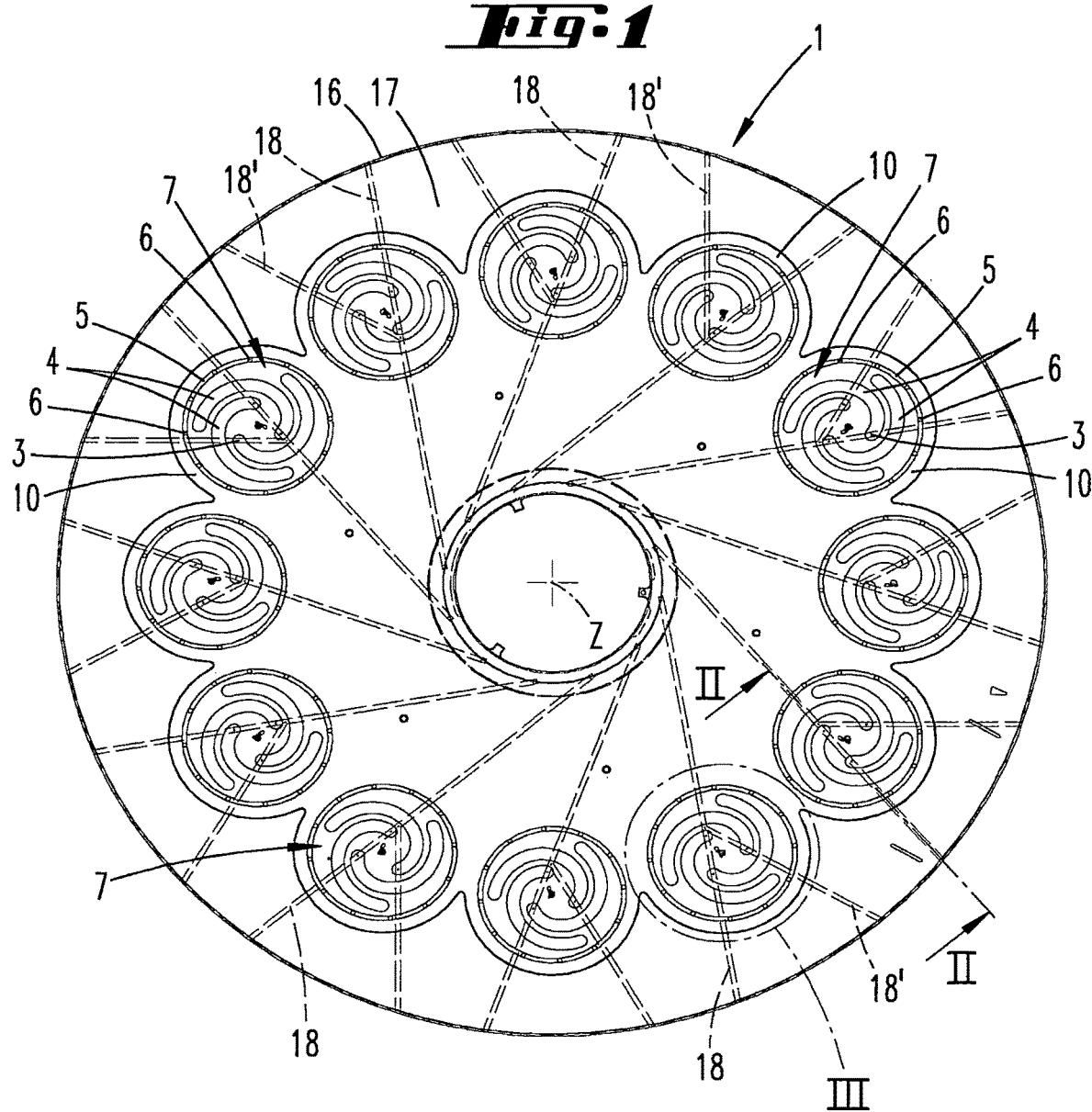
FIG. 1 shows a plan view onto a susceptor in accordance with the invention, with twelve bearing surfaces 7 arranged on a circular arc line around the center of the susceptor, in each case for the support of a substrate.
Figure 2:
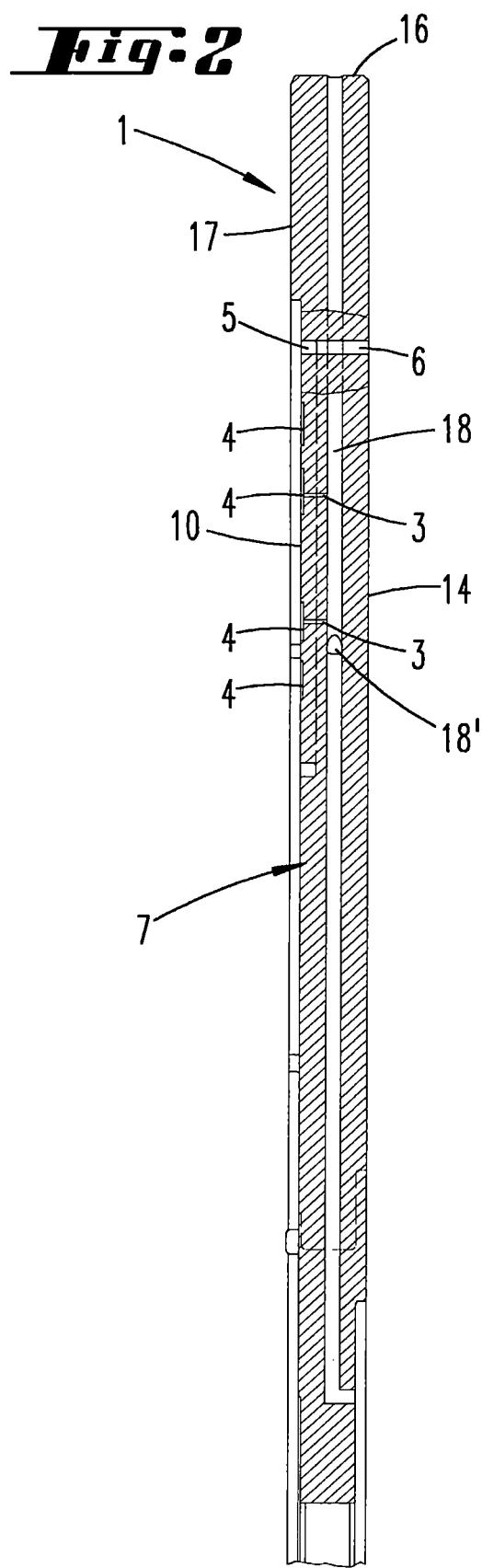
FIG. 2 shows in an enlarged view a section along the line II-II in FIG. 1.
Figure 3:
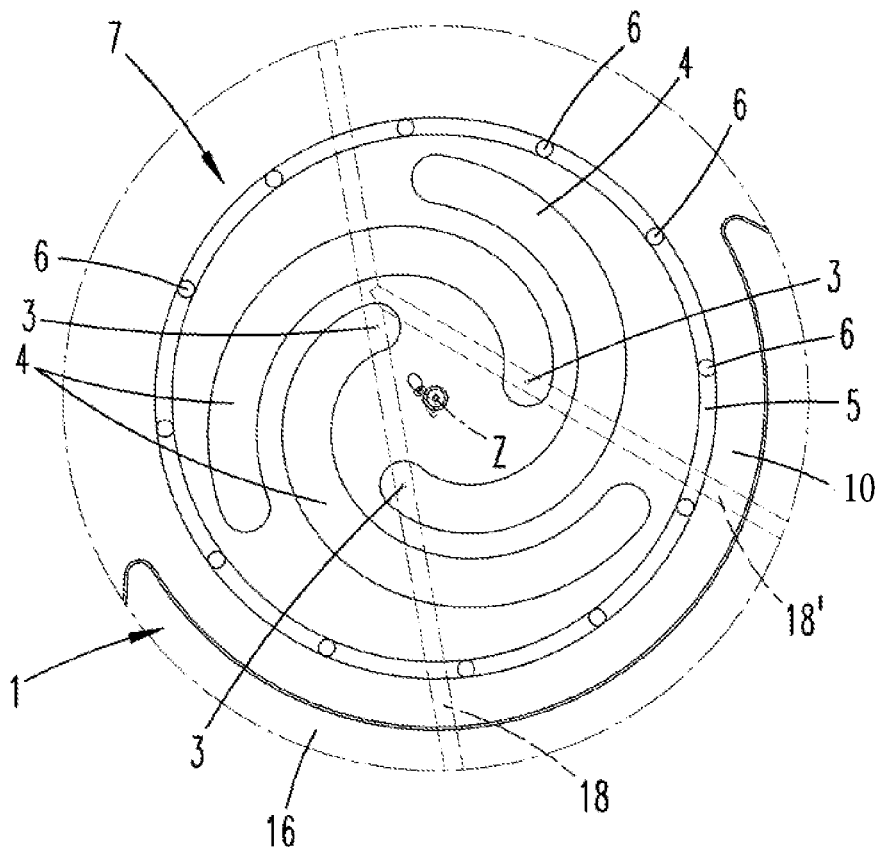
FIG. 3 shows in an enlarged view the detail III in FIG. 1.

The inventive susceptor 1 is used in a CVD reactor, in particular an MOCVD reactor, as illustrated in FIG. 8. In a housing 23, which can be evacuated, is located a process chamber, into which process gases are fed by means of a gas inlet unit 22. The process gases are fed into a center of the process chamber, the floor of which is formed by a broad surface of the susceptor 1 facing upwards. The susceptor can have the shape illustrated in FIG. 1, that is to say, it can have, for example, twelve bearing surfaces 7, arranged at regular intervals around the center, wherein each bearing surface 7 is designed as a pocket. The pocket can consist of a recess in the susceptor 1 made of graphite. However, it is also possible to form the pockets from cover plates, which form circular openings.

The susceptor 1 is heated from below by means of a heating device 21, such that heat flows through the susceptor 1, into the substrate holder 2, through the substrate holder 2 to a substrate 19 lying on the substrate holder 2, so as to bring the substrate surface up to a process temperature at which process gases fed through the gas inlet unit 22 decompose on the substrate surface, such that a single-crystalline layer, in particular a III-V-layer, is deposited there. For this purpose, organometallic compounds of an element of the III-main group or hydrides of elements of the V-main group are fed through the gas inlet unit 22, together with a carrier gas, for example hydrogen.

The floor of the pocket formed by cover plates 15', or by a step 15 of the susceptor 1, forms a bearing surface 7 for a circular disc-shaped substrate holder 2 made of graphite. The bearing surface 7 forms a first, central radial zone 11, into which extend spiral-shaped gas conduction channels 4, into which a carrier gas is fed through a gas supply line 3.

For this purpose, the gas supply lines 3 are connected to supply lines 18 within the susceptor 1.

Radially outside the first radial zone 11 extends a second, narrower, annular radial zone 12, which is essentially formed by a gas collection channel 5. The gas collection channel 5 can have a cross-sectional area of 3×3 mm, and extends along a circular arc line around a center Z of the bearing surface 7. The second radial zone 12, formed by the gas collection channel 5, thus surrounds the first central circular radial zone 11, into which the carrier gas is fed, such that a gas cushion is formed, which holds the substrate holder 2 in a floating state.

Discharge channels 6 originate from the floor of the gas collection channel 5 in a uniform peripheral distribution. The discharge channels 6 are designed as bores, and are spaced apart from each other by a maximum of 10 cm, preferably a maximum of 4 cm. The diameter of the holes forming the discharge channel lies in the range between 2 and 4 mm. The bores preferably have a minimum diameter of 1 mm, preferably a minimum diameter of 2.5 mm, and preferably a minimum diameter of 3 mm.

A third radial zone 13 extends radially outside the gas collection channel 5; in the example embodiment the radial extent of the third radial zone 13 is greater than the radial extent of the second radial zone 12. The radial extent of the third radial zone 13 is preferably at least 5 mm. In the region of the third radial zone 13, the bearing surface 7 forms a flat surface, which forms a gap boundary surface 10. A surface 20 congruent with the first gap boundary surface 10 is formed by an annular zone of the lower face 2' of the substrate holder 2. In a basic state, in which no carrier gas is fed through the gas supply lines 3 and consequently no gas cushion is formed in the region between the lower face 2' and the bearing surface 7, the edge surface 20 of the substrate holder 2 lies flat in a sealing manner on the gap boundary surface 10. The gap boundary surface 10 of the third radial zone 13 preferably lies at the same level as a surface in which the gas conduction channels 4 extend, so that the gas collection channel 5 is a recess in a plane formed by the surfaces 8, 10.

If a gas flow is fed into the gas supply line 3, the gas flow is caused to rotate by the gas conduction channels 4, and lifts the substrate holder 2, wherein at the same time the gas flow causes the substrate holder 2 to rotate about its figure axis. In the inventive use, and/or in the inventive method, the gas flow, which is fed into the volume between the lower face 2' of the substrate holder 2 and the bearing surface 7, is dimensioned such that a gap 9 with a gap height of at most 300 μm is formed between the two gap boundary surfaces 10, 20. By virtue of the dimensioning and number of the discharge channels 6, and the radial length of the third radial zone 13, the flow resistance of the gap 9 is considerably greater than the flow resistance of a gas discharge system that is formed by the discharge channels 6. The difference is preferably by at least a factor of 20, or a factor of at least 50. As a result, 90 percent or more of the carrier gas flows through the discharge system formed by the discharge channels 6, and only a maximum of 10 percent of the carrier gas flows through the gap 9 into the process chamber.

The second example embodiment illustrated in FIG. 6 essentially differs from the first example embodiment illustrated in FIG. 5 in that the discharge system 6 does not terminate on the rear face 14 of the susceptor 1, as in the first example embodiment, but rather on a peripheral wall 16.

The third example embodiment illustrated in FIG. 7 differs from the first example embodiment shown in FIG. 5 essentially only in that the discharge channel 6 terminates on an upper face 17 of the susceptor 1 facing towards the process chamber, wherein the issuing of the discharge channel 6 is arranged downstream of the bearing site 7 in the direction of flow S through the process chamber.

Figure 4:
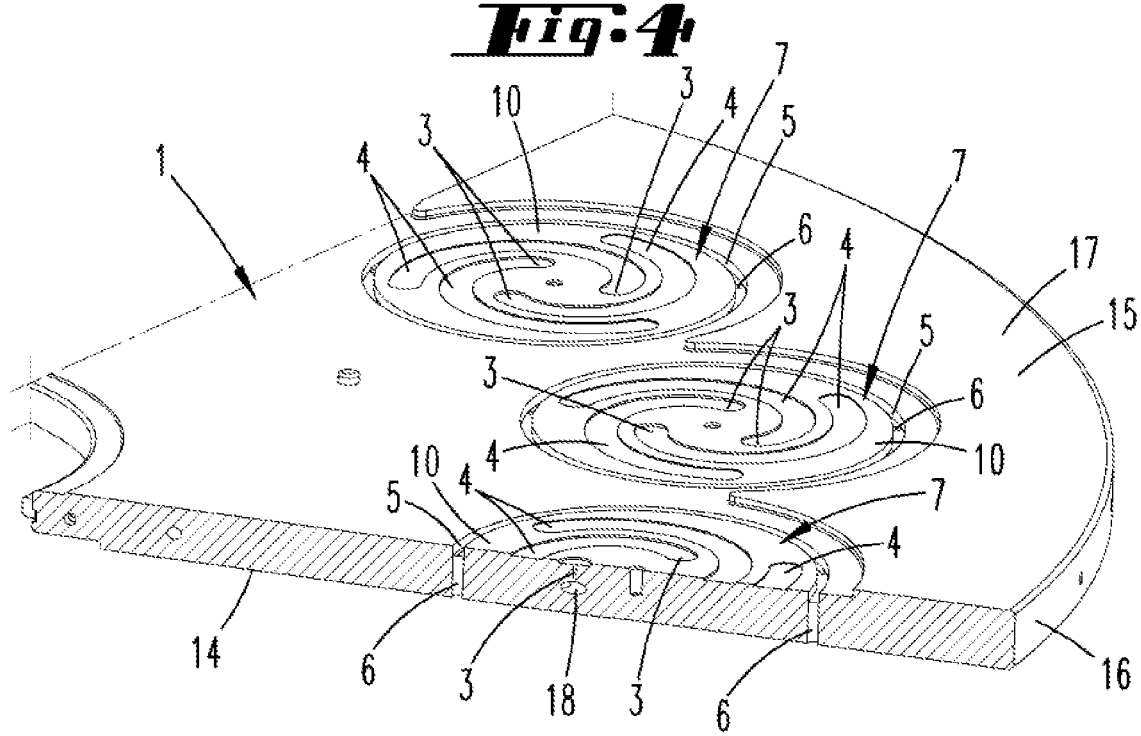
FIG. 4 shows a segment in a three-dimensional illustration along a section line II-II in FIG. 1.

FIG. 4 shows an example embodiment of a susceptor 1, wherein the radially outer surrounding wall of the bearing sites 7 is formed by a semicircular step 15, which is connected in a materially integral manner to the part of the susceptor 1 forming the bearing surface 7. Cover plates (not shown) are provided, which form semicircular steps, and which complete the wall of the pockets forming the bearing surfaces 7 on the radially inward side.

In the example embodiment illustrated in FIG. 9, the susceptor 1 has an essentially flat broad surface. Here, the walls of the pockets are formed by the curved walls of cover plates (not shown). The cover plates lie on the broad surface of the susceptor. The bearing surfaces 7 also extend in this plane.

In the example embodiment illustrated in FIG. 10, the radially inward wall of the pocket forming the bearing surface 7 is formed by a radially inner plinth of the susceptor 1, which is connected to the area of the susceptor 1 forming the bearing surfaces 7 in a materially integral manner. The radially outer walls of the bearing pockets are here formed by cover plates (not shown).

Figure 11:
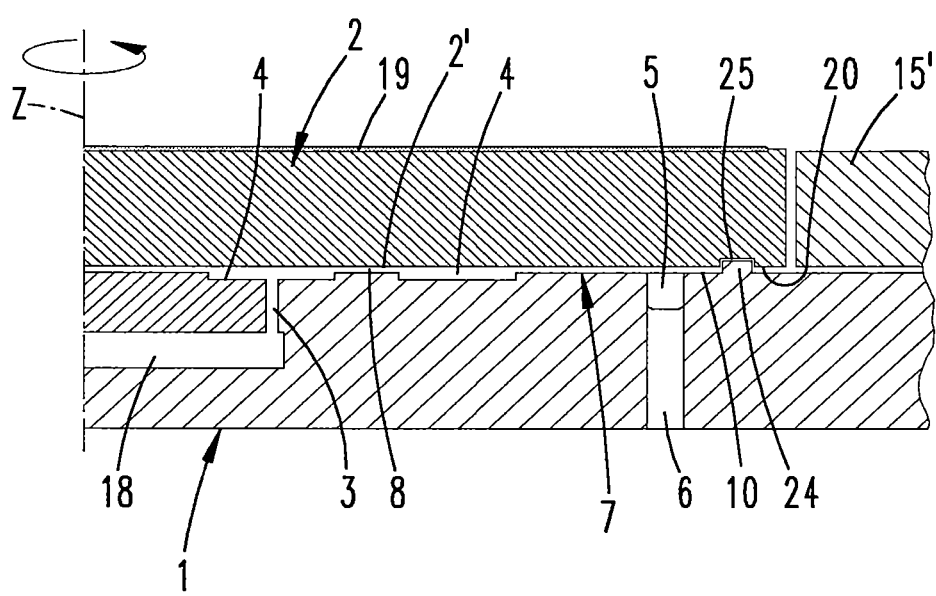
FIG. 11 shows an illustration as in FIG. 5 of a further example embodiment.

In the example embodiment shown in FIG. 11, the edge surfaces 10, 20, of the bearing surface 7 and the lower face 2' of the substrate holder 2 respectively, have intermeshing structures 24, 25. These preferably take the form of annular structures, which form a kind of labyrinth seal. In the example embodiment, a rib 24 is provided, which engages in an annular groove 25. The rib 24 can be formed by one of the two surfaces 10, 20. The annular groove is then formed by the respectively other surface 20, 10. In the example embodiment, the rib 24 originates from the bearing surface 7 and the annular groove 25 is incorporated into the lower face 2' of the substrate holder 2. In the example embodiment, the rib 24 and the annular groove 25 are arranged radially outside the gas collection channel 5. The substrate holder 2 is located in a pocket that is formed by a cover plate 15'.

The above statements serve to explain the inventions covered by the application as a whole, which inventions in each case also independently further the prior art at least by means of the following combinations of features, wherein two, a plurality, or all, of these combinations of features can also be combined, namely:

A susceptor, which is characterized in that the cross-sectional area of the discharge channels 6 and the radial length of the gap 9 are dimensioned such that the gas volumetric flow rate through the gas discharge system 6 is greater than that through the gap 9 with a gap height of 300 µm.

A susceptor, which is characterized in that the circular surface has a radial length of at least 5 mm with respect to the center Z, and in that the discharge channels 6 are at least four bores with a diameter of at least 2 mm, preferably of at least 4 mm.

A susceptor, which is characterized in that the third radial zone 13 is formed by an annular closed surface 10 with a radial length of at least 4 mm, which in the radially inward direction is adjacent to a gas collection channel 5 formed by a recess, from which originate in particular at least four discharge channels 6, which issue outside the bearing surface 7, and in particular are bores with a diameter of at least 2 mm, preferably of at least 3 mm.

A susceptor, which is characterized in that the bearing site 7 is bounded in the radially outward direction by a step 15, or by a cover plate 15', and/or in that the surface 10 is flat.

A susceptor, which is characterized in that the discharge channels 6 terminate on a rear face 14 opposite the bearing surface 7, on an edge face 16, or downstream of the bearing surface 7 on the broad surface 17 of the susceptor 1.

A susceptor, which is characterized in that the diameters and the number of the leakage channels 6 are selected such that the following relationship is satisfied:

$$n \cdot r^4 > \frac{2 \cdot d \cdot l_a}{3 \cdot l_s} \cdot h^3$$

where r: radius of the discharge channel (6), $l_a$: length of a discharge channel (6), n: number of discharge channels (6), d: diameter of the third edge zone (13), $l_s$: radial length of the gap (9), h: maximum height of the gap (9), wherein the left-hand side of the relationship is preferably at least ten times, more preferably at least twenty times, and particularly preferably at least fifty times as large as the right-hand side of the relationship.

A susceptor arrangement, consisting of a susceptor 1 in accordance with one of the preceding claims, and a substrate holder 2, supported on the bearing surface 7 such that it can rotate, wherein the substrate holder 2 has a circular disc-shaped form, and, at least in a radially outer region extending congruently with the third radial zone 13, has an annular, in particular a flat, edge surface 20 which, together with the surface 10 of the third radial zone 13, bounds the gap 9 with a constant gap height.

A susceptor, or a susceptor arrangement, which is characterized in that the surfaces 10, 20 bounding the gap 9 do not have any other gas discharge systems, but rather are formed by two congruent, closed annular surfaces.

A susceptor, or a susceptor arrangement, which is characterized in that the surface 10 forming the radially outer edge of the bearing surface 7, and the corresponding edge surface 20 of the substrate holder 2, have intermeshing annular structures, which in particular are designed as an annular rib 24 engaging in an annular groove 25.

A use, which is characterized in that the gas flow fed into the volume between the bearing surface 7 and the lower surface 2' of the substrate holder 2 generates a pressure, which holds the substrate holder in a floating state, and generates a gap height less than 300 µm, and preferably in a range between 50 or 100 µm, and 250 µm.

A CVD reactor, which is characterized in that the susceptor 1 and the substrate holder 2 are designed according to one of the Claims 1 to 9.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterise with their features independent inventive further developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognisably be dispensed with for the respective intended use, or can be replaced by other means having the same technical effect.

LIST OF REFERENCE SYMBOLS

1 Susceptor
2 Substrate holder
2' Lower surface of substrate holder
2" Side surface of substrate holder
3 Gas supply line
4 Gas duct
5 Gas collection channel
6 Discharge channel
7 Bearing surface
8 Gap
9 Gap
10 Surface
11 First radial zone
12 Second radial zone
13 Third radial zone
14 Rear face
15 Step
15' Cover plate
16 Edge face
17 Upper face
18 Supply line
18' Supply line
19 Substrate
20 Edge surface
21 Heating device
22 Gas inlet unit
23 Housing
24 Rib
25 Annular groove
S Flow direction
Z Center

What is claimed is:

1. A susceptor (1), comprising:
a circular disc-shaped substrate holder (2); and
a bearing surface (7) with a circular outline, for supporting the circular disc-shaped substrate holder (2),
wherein the bearing surface (7) has a first radial zone (11), in which at least one gas distribution channel (4) fluidly coupled to a gas supply line (3) extends, a second radial zone (12), which is radially offset from the first radial zone (11) with respect to a center (Z) of the bearing surface (7), and which forms a gas discharge system with one or more discharge channels (6), and a third radial zone (13), which surrounds the first radial zone (11) and the second radial zone (12), and forms a gap (9) between the bearing surface (7) and a lower face (2') of the substrate holder (2), which gap (9) is directly adjacent to a radially outer edge of the bearing surface (7), wherein the first, second and third radial zones (11, 12, 13) are configured such that a gas flow fed into the first radial zone (11) through the gas supply line (3) (i) generates a pressure in a volume between the bearing surface (7) and the lower face (2') of the substrate holder (2), which pressure holds the substrate holder (2) in a floating state, (ii) rotates the circular disc-shaped substrate holder (2) about the center (Z), and (iii) leaves the volume through the gas discharge system and through the gap (9),
wherein a height of the gap (9) defines a volumetric flow rate of a gas flow ($Q_s$) through the gap (9) and is configured to be varied in a range between 50 μm and 300 μm by means of a variation of the gas flow fed into the first radial zone (11),
wherein a cross-sectional area of the one or more discharge channels (6) and a radial length of the gap (9) are dimensioned such that a maximum of 10% of the gas flow leaves through the gap (9) with a gap height of 300 μm,
wherein the third radial zone (13) is formed by an annular surface (10) with a radial length of at least 4 mm, which in a radially inward direction is adjacent to a gas collection channel (5) formed by a recess,
wherein the annular surface (10) forms a radially outer edge of the bearing surface (7), and
wherein the discharge channels (6) comprise at least four bores that open into the gas collection channel (5) away from the bearing surface (7), and have respective diameters of at least 2 mm.

2. A susceptor (1), comprising:
a circular disc-shaped substrate holder (2); and
a bearing surface (7) with a circular outline, for supporting the circular disc-shaped substrate holder (2) by means of a gas flow in a floating state, the gas flow causing the circular disc-shaped substrate holder (2) to rotate about a center (Z) of the bearing surface (7),
wherein the bearing surface (7) has a first radial zone (11), in which at least one gas distribution channel (4) fluidly coupled to a gas supply line (3) extends, a second radial zone (12), which is radially offset from the first radial zone (11) with respect to the center (Z) and which has a gas collection channel (5) formed by a recess, from which discharge channels (6) open into the gas collection channel (5) away from the bearing surface (7), and a third radial zone (13), which forms an annular surface (10) surrounding the first radial zone (11) and the second radial zone (12), and forming a radially outer edge of the bearing surface (7), which in a radially inward direction, is adjacent to the gas collection channel (5), and
wherein a gap (9) is formed between the annular surface (10) and a lower face (2') of the circular disc-shaped substrate holder (2),
wherein a height of the gap (9) defines a first volumetric flow rate of a gas flow ($Q_s$) through the gap (9) and is configured to be varied in a range between 50 μm and 300 μm by means of a variation of the gas flow,
wherein the gas flow generates a pressure in a volume between the bearing surface (7) and the lower face (2') of the circular disc-shaped substrate holder (2),
wherein the cross-sectional area of the discharge channels (6) and the radial length of the gap (9) are dimensioned such that a second volumetric flow rate of a gas flow ($Q_a$) through the gas discharge channels (6) is greater than the first volumetric flow rate of the gas flow ($Q_s$) through the gap (9) with a gap height of 300 μm, and
wherein the annular surface (10) having a radial length of at least 4 mm with respect to the center (Z), and the discharge channels (6) comprise at least four bores with respective diameters of at least 2 mm.

3. The susceptor (1) of claim 1, wherein the discharge channels (6) terminate on a rear face (14) of the susceptor (1) opposite the bearing surface (7).

4. The susceptor (1) of claim 1, wherein the respective diameters and a total number of the discharge channels (6) are selected such that the following relationship is satisfied:

$$n \cdot r^4 > \frac{2 \cdot d \cdot l_a}{3 \cdot l_s} \cdot h^3$$

wherein r represents a radius of each of the discharge channels (6), $l_a$ represents a length of each of the discharge channels (6), n represents the total number of the discharge channels (6), d represents a diameter of the third edge zone (13), $l_s$ represents a radial length of the gap (9), h represents a maximum height of the gap (9), and wherein a left-hand side of the relationship is at least ten times as large as a right-hand side of the relationship.

5. The susceptor (1) of claim 1, wherein the annular surface (10) forming the radially outer edge of the bearing surface (7), and a corresponding edge surface (20) of the substrate holder (2) have intermeshing annular structures, which are formed as an annular rib (24) engaging in an annular groove (25).

6. A chemical vapor deposition (CVD) reactor, comprising:
 a process chamber arranged in a housing (23);
 a gas inlet unit (22) opening into the process chamber for feeding process gases into the process chamber;
 the susceptor (1) of claim 1 disposed in the housing (23); and
 a heating device (21) for heating the susceptor (1).

7. The susceptor (1) of claim 2, wherein the discharge channels (6) terminate on a rear face (14) of the susceptor (1) opposite the bearing surface (7).

8. The susceptor (1) of claim 2, wherein the annular surface (10) forming the radially outer edge of the bearing surface (7), and a corresponding edge surface (20) of the substrate holder (2) have intermeshing annular structures, which are formed as an annular rib (24) engaging in an annular groove (25).

9. A chemical vapor deposition (CVD) reactor, comprising:
 a process chamber arranged in a housing (23);
 a gas inlet unit (22) opening into the process chamber for feeding process gases into the process chamber;
 the susceptor (1) of claim 2 disposed in the housing (23); and
 a heating device (21) for heating the susceptor (1).

10. A susceptor (1), comprising:
 a circular disc-shaped substrate holder (2); and
 a bearing surface (7) with a circular outline around a center (Z) for supporting the circular disc-shaped substrate holder (2),
 wherein the bearing surface (7) has a first radial zone (11), in which at least one gas distribution channel (4) fluidly coupled to a gas supply line (3) extends, a second radial zone (12), which is radially offset from the first radial zone (11) with respect to the center (Z) of the bearing surface (7), and which forms a gas discharge system with a collection channel (5) and extends along a circular arc line around the center (Z), with one or more discharge channels (6) that open into the gas collection channel (5), a third radial zone (13), which surrounds the first radial zone (11) and the second radial zone (12), and forms a gap (9) between the bearing surface (7) and a lower face (2') of the substrate holder (2), which gap (9) is directly adjacent to a radially outer edge of the bearing surface (7) and directly adjacent to the collection channel (5),
 wherein the first, second and third radial zones (11, 12, 13) are configured such that a gas flow fed into the first radial zone (11) through the gas supply line (3) (i) generates a pressure in a volume between the bearing surface (7) and a lower face (2') of the substrate holder (2), which pressure holds the substrate holder (2) in a floating state, (ii) rotates the circular disc-shaped substrate holder (2) about the center (Z), and (iii) leaves the volume through the gas discharge system and through the gap (9),
 wherein a height of the gap (9) defines a volumetric flow rate of a gas flow ($Q_s$) through the gap (9) and is configured to be varied in a range between 50 µm and 300 µm by means of a variation of the gas flow fed into the first radial zone (11),
 wherein a radial length of the gap (9), a radius of each of the discharge channels (6), and a total number of the discharge channels (6) are selected such that the following relationship is satisfied:

$$n \cdot r^4 > \frac{2 \cdot d \cdot l_a}{3 \cdot l_s} \cdot h^3$$

wherein r represents the radius of each of the discharge channels (6), $l_a$ represents a length of each of the discharge channels (6), n represents the total number of the discharge channels (6), d represents a diameter of the third edge zone (13), $l_s$ represents the radial length of the gap (9), h represents a maximum height of the gap (9),
 wherein a left-hand side of the relationship is at least fifty times as large as a right-hand side of the relationship, and
 wherein $l_s$ is at least 5 mm, and h is 300 µm.

11. The susceptor (1) of claim 10, wherein the discharge channels (6) are spaced apart from each other by a maximum of 4 cm.

12. The susceptor (1) of claim 11, wherein the gas collection channel (5) has a cross-sectional area of 3×3 mm.

* * * * *